(12) United States Patent
Lin et al.

(10) Patent No.: US 11,463,058 B2
(45) Date of Patent: Oct. 4, 2022

(54) FEEDBACK SYSTEM AND ASSOCIATED SIGNAL PROCESSING METHOD

(71) Applicant: Realtek Semiconductor Corp., HsinChu (TW)

(72) Inventors: Shih-Hsin Lin, HsinChu (TW); Yi-Chang Tu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 136 days.

(21) Appl. No.: 17/068,782

(22) Filed: Oct. 12, 2020

(65) Prior Publication Data

US 2021/0111683 A1    Apr. 15, 2021

(30) Foreign Application Priority Data

Oct. 15, 2019  (TW) ................ 10813702.4

(51) Int. Cl.
*H03G 3/30* (2006.01)
*H03F 3/183* (2006.01)
*H04R 3/02* (2006.01)

(52) U.S. Cl.
CPC ............ *H03G 3/301* (2013.01); *H03F 3/183* (2013.01); *H03F 2200/03* (2013.01); *H03F 2200/375* (2013.01); *H03G 2201/103* (2013.01); *H04R 3/02* (2013.01)

(58) Field of Classification Search
CPC .... H03G 3/301; H03G 2201/103; H03G 3/30; H03F 3/183; H03F 2200/03; H03F 2200/375; H03F 1/34; H04R 3/02

USPC ......... 330/86, 129, 260, 265, 271, 278, 282, 330/291
See application file for complete search history.

(56) References Cited

U.S. PATENT DOCUMENTS

| | | | | |
|---|---|---|---|---|
| 5,426,395 A * | 6/1995 | Cygan | ...................... | H03F 1/52 330/207 P |
| 6,028,496 A * | 2/2000 | Ko | ........................ | H03H 11/50 333/214 |
| 6,441,686 B1 * | 8/2002 | Nakamura | ........... | H03G 3/3036 330/85 |
| 6,710,647 B1 * | 3/2004 | Mise | ...................... | H03F 1/3247 330/144 |
| 6,992,526 B2 * | 1/2006 | Cheng | .................. | H03F 3/45973 327/307 |
| 7,695,085 B2 * | 4/2010 | Bae | ...................... | H03F 3/45098 330/254 |
| 10,819,297 B1 * | 10/2020 | Delshadpour | ....... | H03F 3/45744 |
| 2009/0066418 A1 * | 3/2009 | Satou | ...................... | H03F 1/223 330/277 |

* cited by examiner

*Primary Examiner* — Khanh V Nguyen
(74) *Attorney, Agent, or Firm* — Winston Hsu

(57) ABSTRACT

The present invention provides a feedback system including a mixing circuit, a forward circuit, a feedback circuit, a feedback gain circuit and a control circuit. In the operations of the feedback system, the mixing circuit generates a mixed signal according to an input signal and a feedback signal, the forward circuit processes the mixed signal to generate an output signal, the feedback gain circuit and the feedback circuit generates the feedback signal according to the output signal, and the control circuit determines a feedback gain of the feedback gain circuit according to a gain of the forward circuit.

13 Claims, 5 Drawing Sheets

FEEDBACK SYSTEM AND ASSOCIATED SIGNAL PROCESSING METHOD

BACKGROUND OF THE INVENTION

1. Field of the Invention

The present invention relates to a feedback system, and more particularly, to a feedback system having fixed settling time.

2. Description of the Prior Art

A general feedback system requires a stabilization time at the beginning operation so that the output signal can be stably generated. However, this stabilization time is affected by a gain of circuits in the feedback system, rather than a constant time. In some applications, the above-mentioned unstable or unexpected stabilization time will affect the subsequent operation of the feedback system or cause inconvenience to the user.

SUMMARY OF THE INVENTION

It is therefore an objective of the present invention to provide a feedback system that has a fixed settling time, to solve the above-mentioned problems.

According to one embodiment of the present invention, a feedback system comprises a mixing circuit, a forward circuit, a feedback circuit, a feedback gain circuit, and a control circuit. In the operations of the feedback system, the mixing circuit generates a mixed signal according to an input signal and a feedback signal, the forward circuit processes the mixed signal to generate an output signal, the feedback gain circuit and the feedback circuit generates the feedback signal according to the output signal, and the control circuit determines a feedback gain of the feedback gain circuit according to a gain of the forward circuit.

According to another embodiment of the present invention, a signal processing method comprises the steps of: generating a mixed signal according to an input signal and a feedback signal; using a forward circuit to process the mixed signal to generate an output signal; determining a feedback gain according to a gain of the forward circuit; and using the feedback gain to process the output signal to generate the feedback signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
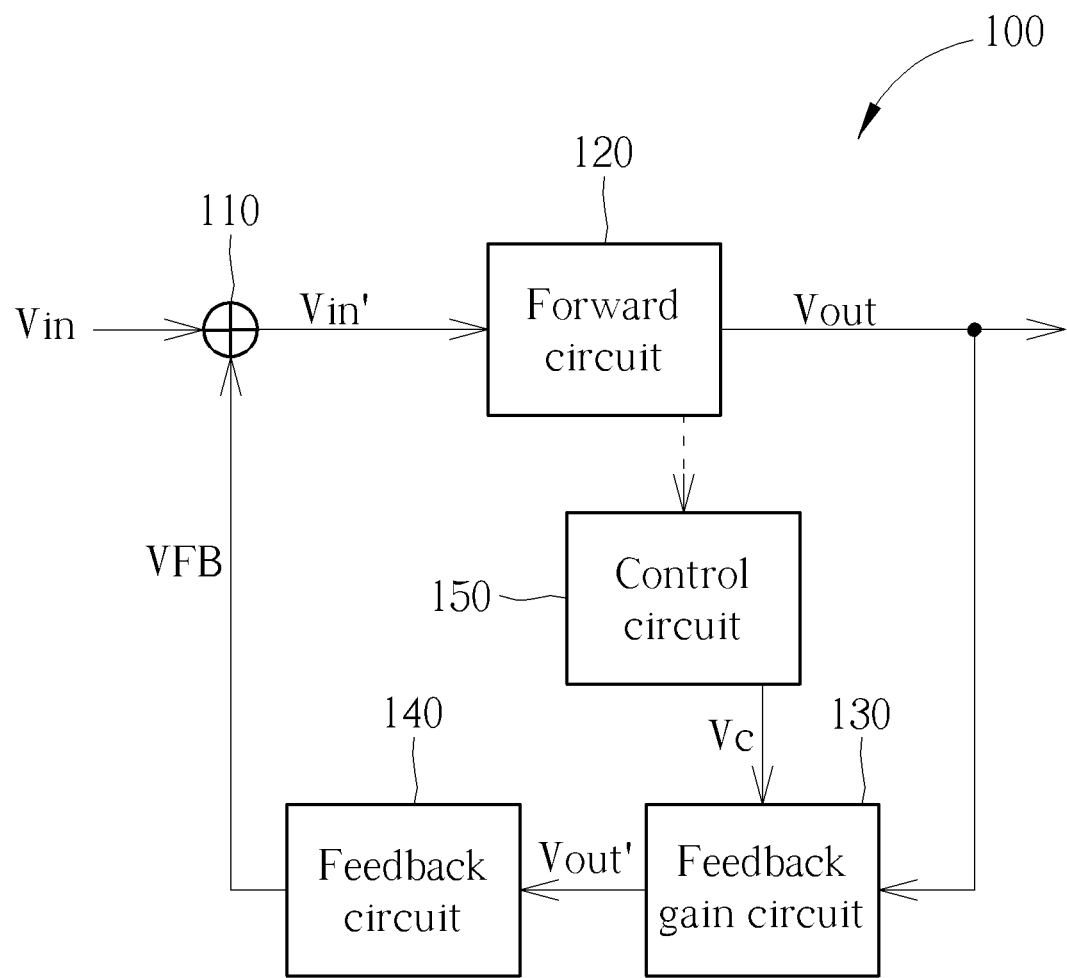
FIG. 1 is a diagram illustrating a feedback system according to one embodiment of the present invention.

FIG. 1 is a diagram illustrating a feedback system 100 according to one embodiment of the present invention. As shown in FIG. 1, the feedback system 100 comprises a mixing circuit 110, a forward circuit 120, a feedback gain circuit 130, a feedback circuit 140 and a control circuit 150. In this embodiment, the feedback system 100 can be applied to any feedback system that requires a fixed stabilization time, such as audio processing circuits, communication-related processing circuits, amplifier circuits, etc.

In the operations of the feedback system 100, when the feedback system 100 is enabled to receive an input signal Vin, such as the feedback system 100 is just powered on, the control circuit 150 obtains the gain of the forward circuit 120, and determines the feedback gain according to the gain of the forward circuit 120, for use by the feedback gain circuit 130 (for example, for Initialization operation, but the present invention is not limited to this). For example, the control circuit 150 can actively detect the gain currently set by the forward circuit 120, or obtain the gain of the forward circuit 120 from a register (not shown), and the control circuit 150 further generates a control signal Vc to set the feedback gain circuit 130 after determining the feedback gain of the feedback gain circuit 130. In this embodiment, the gain of the forward circuit 120 and the feedback gain of the feedback gain circuit 130 have an opposite trend, that is, when the gain of the forward circuit 120 increases, the control circuit 150 decreases the feedback gain of the feedback gain circuit 130; and when the gain of the forward circuit 120 decreases, the control circuit 150 increases the feedback gain of the feedback gain circuit 130. In other words, when the forward circuit 120 has a first gain, the control circuit 150 controls the feedback gain circuit 130 to have a first feedback gain; and when the forward circuit 120 has a second gain greater than the first gain, the control circuit 150 controls the feedback gain circuit 130 to have a second feedback gain smaller than the first feedback gain.

While the control circuit 150 generates the control signal Vc to set the feedback gain of the feedback gain circuit 130, or after the control circuit 150 generates the control signal Vc to set the feedback gain of the feedback gain circuit 130, the mixing circuit 110 receives an input signal Vin and a feedback signal VFB to generate a mixed signal Vin', the forward circuit 120 processes the mixed signal Vin' to generate an output signal Vout, the feedback gain circuit 130 receives the output signal Vout to generate an adjusted output signal Vout', and the feedback circuit 140 receives the adjusted output signal Vout' to generate the feedback signal VFB. By using the above operations, the feedback system 100 generates the stable output signal Vout after a period of time (i.e. the stabilization time).

In the embodiment shown in FIG. 1, the stabilization time of the feedback system 100 is mainly affected by the gain of the forward circuit 120. Therefore, this embodiment specifically sets an additional feedback gain circuit 130 with the adjustable gain, so that the feedback system 100 can have a fixed or stable stabilization time. In detail, assuming that the forward circuit 120 has a higher gain, the stabilization time of the feedback system 100 will be too fast if the feedback gain circuit 130 is not provided in the feedback system 100. Therefore, by setting the feedback gain circuit 130 to have a lower feedback gain, the stabilization time of the feedback system 100 can be stabilized. Similarly, assuming that the forward circuit 120 has a lower gain, the stabilization time of the feedback system 100 will be too slow if the feedback gain circuit 130 is not provided in the feedback system 100. Therefore, by setting the feedback gain circuit 130 to have a higher feedback gain, the stabilization time of the feedback system 100 can be stabilized.

As described above, the feedback system 100 of this embodiment can provide a stable and predictable stabilization time when the forward circuit 120 has different gain values, so as to facilitate the engineers or users.

It should be noted that the above-mentioned technique for stabilizing the stabilization time by setting the feedback gain of the feedback gain circuit 130 is not only applicable to the situation that the feedback system 100 is initially enabled or powered on. In other embodiments of the present invention, if the gain value of the forward circuit 120 of the feedback system 100 is changed during the operations, the control circuit 150 may dynamically adjust the feedback gain of the feedback gain circuit 130 based on the gain value of the forward circuit 120 in real time.

Figure 2:
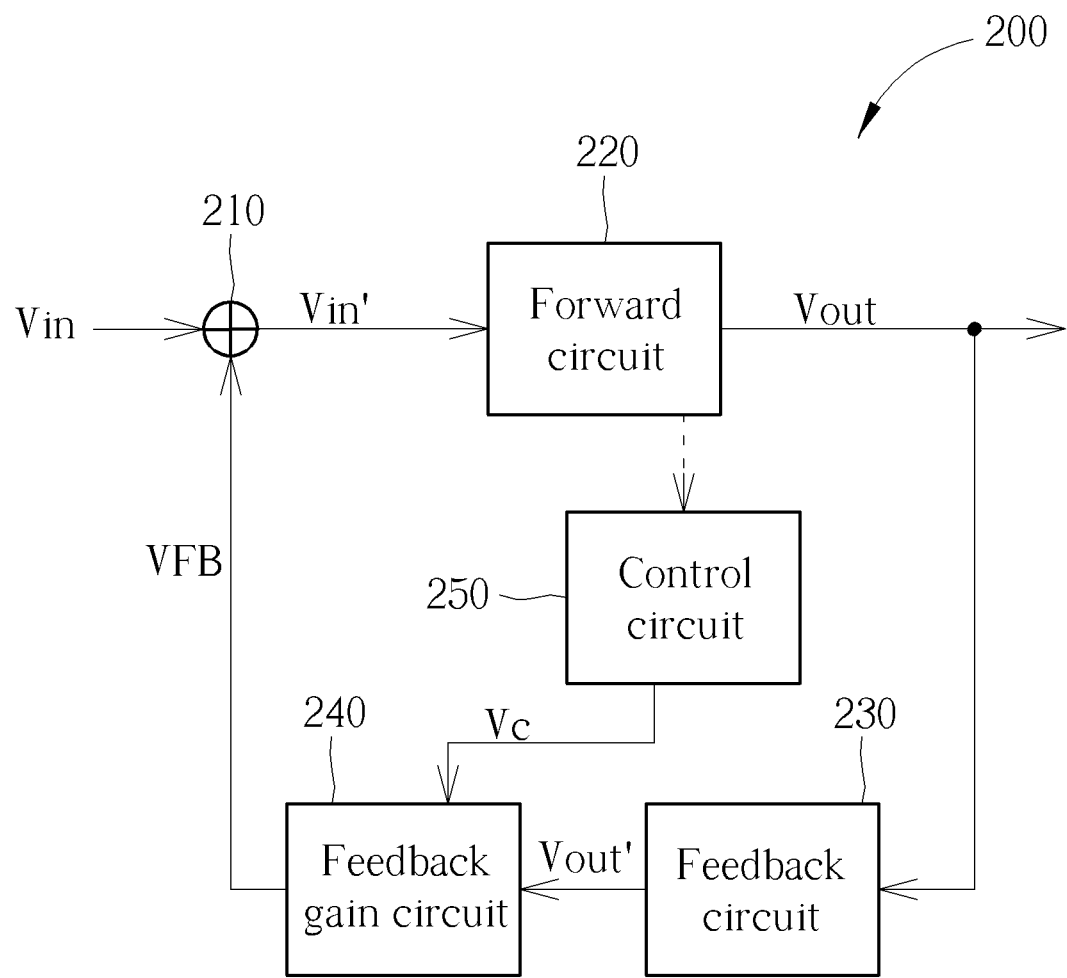
FIG. 2 is a diagram illustrating a feedback system according to another embodiment of the present invention.

FIG. 2 is a diagram illustrating a feedback system 200 according to another embodiment of the present invention. As shown in FIG. 2, the feedback system 200 comprises a mixing circuit 210, a forward circuit 220, a feedback circuit 230, a feedback gain circuit 240 and a control circuit 250. The difference between the feedback system 200 and the feedback system 100 shown in FIG. 1 is only the positions of the feedback circuit 230 and the feedback gain circuit 240, that is, the feedback circuit 230 receives the output signal Vout to generate an adjusted output signal Vout' and the feedback gain circuit 240 receives the adjusted output signal Vout' to generate the feedback signal VFB. Since a person skilled in the art should be able to understand the operations of the feedback system 200 after reading the embodiment shown in FIG. 1, further descriptions are omitted here.

Figure 3:
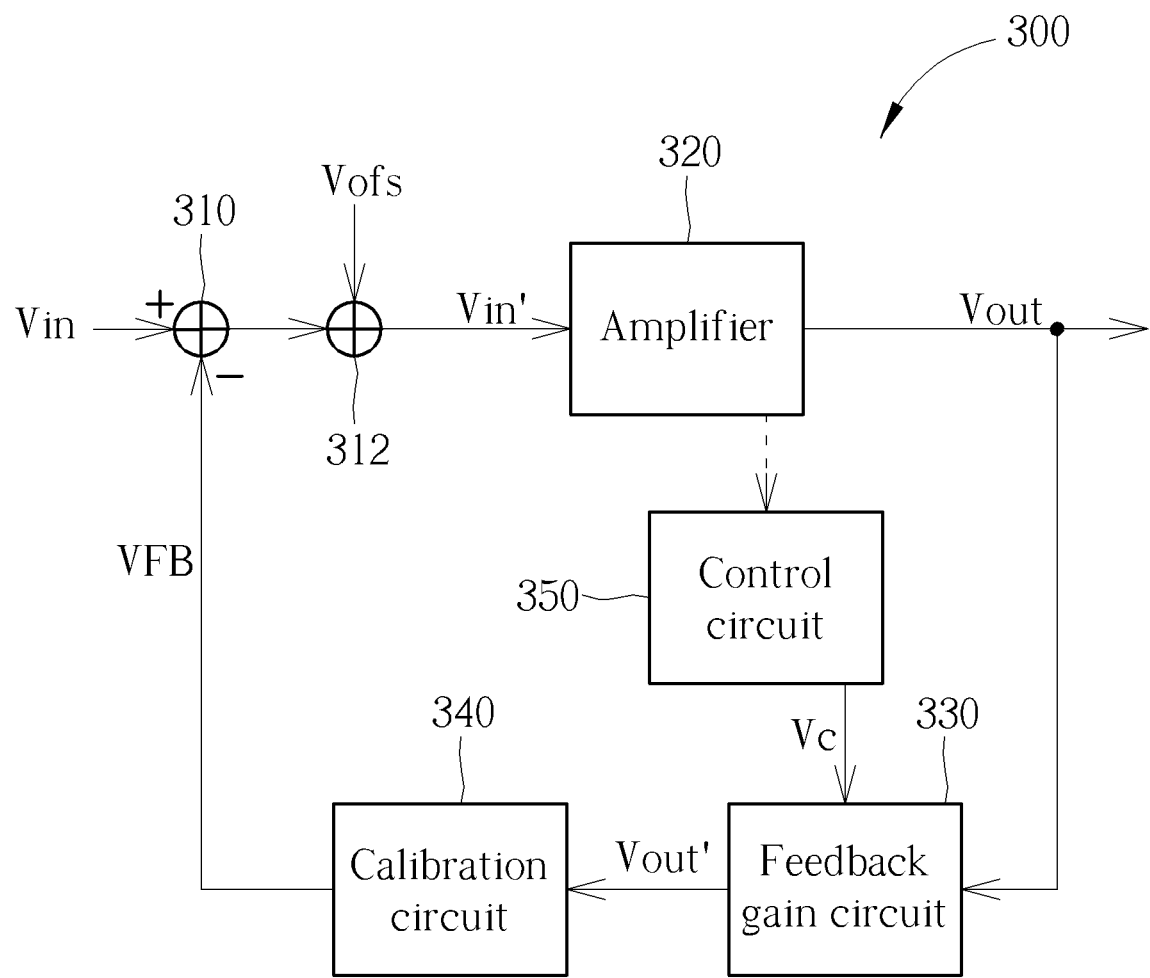
FIG. 3 is an audio processing system according to one embodiment of the present invention.

FIG. 3 is a diagram illustrating an audio processing system 300 according to one embodiment of the present invention, wherein the audio processing system is an example of the feedback system 100 shown in FIG. 1. As shown in FIG. 3, the audio processing system 300 comprises a mixing circuit 310, an amplifier 320, a feedback gain circuit 330, a calibration circuit 340 and a control circuit 350. In this embodiment, due to the circuit operation and the influence of the signal path, the audio processing system 300 will have a DC offset, such as the DC offset Vofs applied through the mixing circuit 312 shown in FIG. 3, causing noise and worsening the quality of the output signal Vout. It should be noted that the mixing circuit 312 is only used to indicate the DC offset Vofs on the audio processing system 300, and it is not a deliberate circuit element.

In order to eliminate the DC offset Vofs in the audio processing system 300, in the operation of the audio processing system 300, when the audio processing system 300 is enabled to start receiving the input signal Vin, the control circuit 350 obtains the gain of the amplifier 320, and the feedback gain of the feedback gain circuit 330 is determined according to the gain of the amplifier 320, for use by the feedback gain circuit 330 (for example, for performing an initialization operation, but the present invention is not limited thereto). The determination of the feedback gain can be referred to the embodiment in FIG. 1, that is, the gain of the amplifier 320 and the feedback gain of the feedback gain circuit 330 have the opposite trend.

While the control circuit 350 generates a control signal Vc to set the feedback gain of the feedback gain circuit 330, or after the control circuit 350 generates the control signal Vc to set the feedback gain of the feedback gain circuit 330, the mixing circuit 310 receives an input signal Vin and a feedback signal VFB to generate a mixed signal Vin', the amplifier 320 processes the mixed signal Vin' to generate an output signal Vout, the feedback gain circuit 330 receives the output signal Vout to generate an adjusted output signal Vout', and the calibration circuit 340 receives the adjusted output signal Vout' to generate the feedback signal VFB. By using the above operations, the audio processing system 300 will generate the stable output signal Vout after a period of time (that is, the stabilization time), and the feedback signal VFB will approach the DC offset Vofs at this time. For example, if the input signal Vin is 0V and the DC offset Vofs is 10 mV, the feedback signal VFB generated by the calibration circuit 340 will be close to 10 mV through the above operations, so that the output signal Vout approaches 0V.

Figure 4:
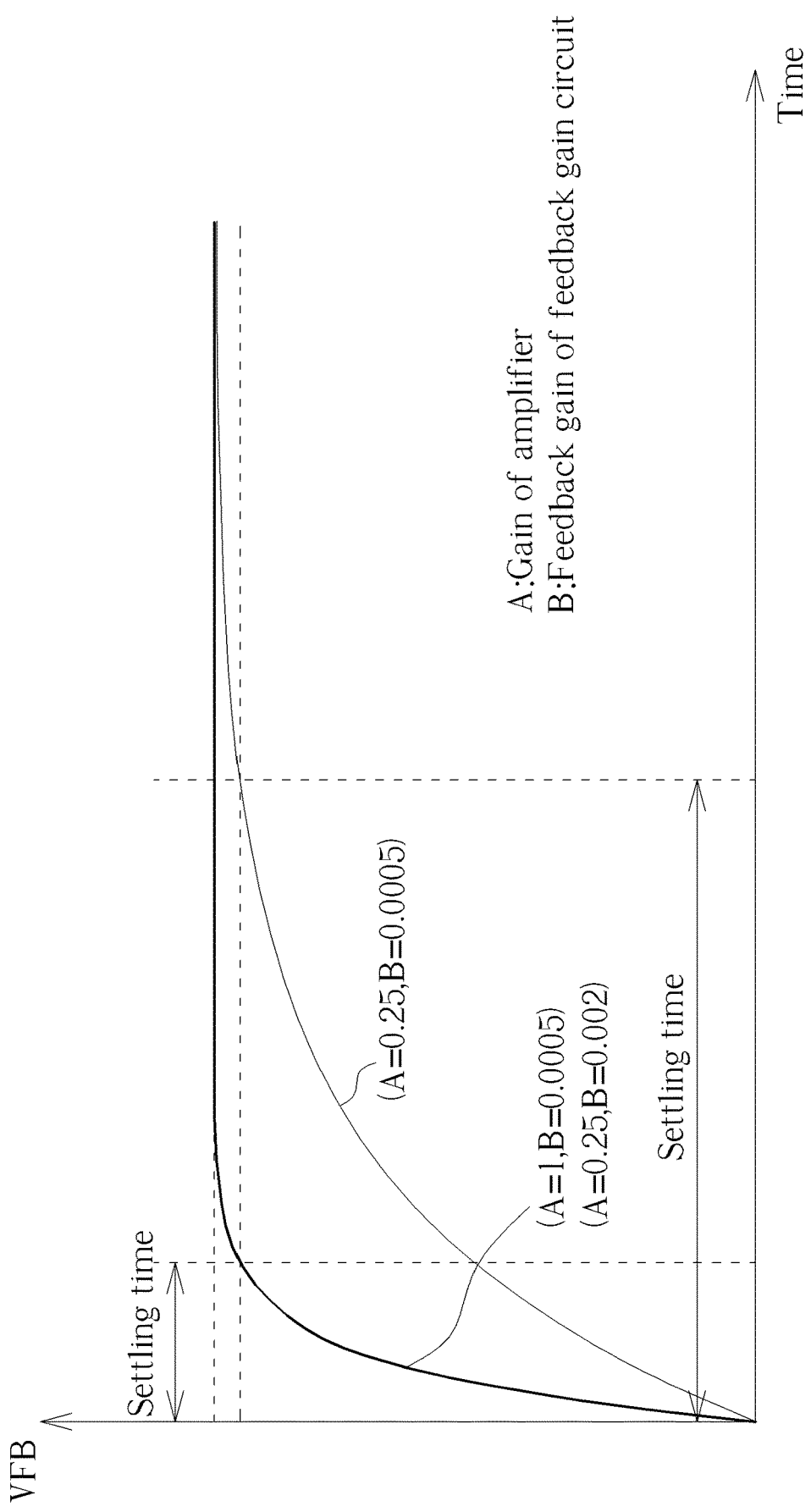
FIG. 4 shows stabilization times of the feedback signal fort different gains and different feedback gains.

In the embodiment shown in FIG. 3, because the amplifier 320 may have different gains due to the consideration of the designer or the user, and the stabilization time of the audio processing system 300 is mainly affected by the gain of the amplifier 320, by intentionally setting a gain-adjustable feedback gain circuit 330, the audio processing system 300 can have a fixed or stable stabilization time. FIG. 4 shows the stabilization times of the feedback signal VFB at different gains and feedback gains. In FIG. 4, assuming that the feedback gain of the feedback gain circuit 330 is preset to "0.0005", the audio processing system 300 will has a shorter settling time when the gain of the amplifier 320 is "1", and the audio processing system 300 will has a longer settling time when the gain of the amplifier 320 is "0.25". Therefore, in order to solve the situation that the stabilization time becomes longer because the gain of the amplifier 320 changes, when the gain of the amplifier 320 is "0.25", the control circuit 350 increases the feedback gain of the feedback gain circuit 330 to be "0.002", so that the audio processing system 300 has the stable settling time.

Figure 5:
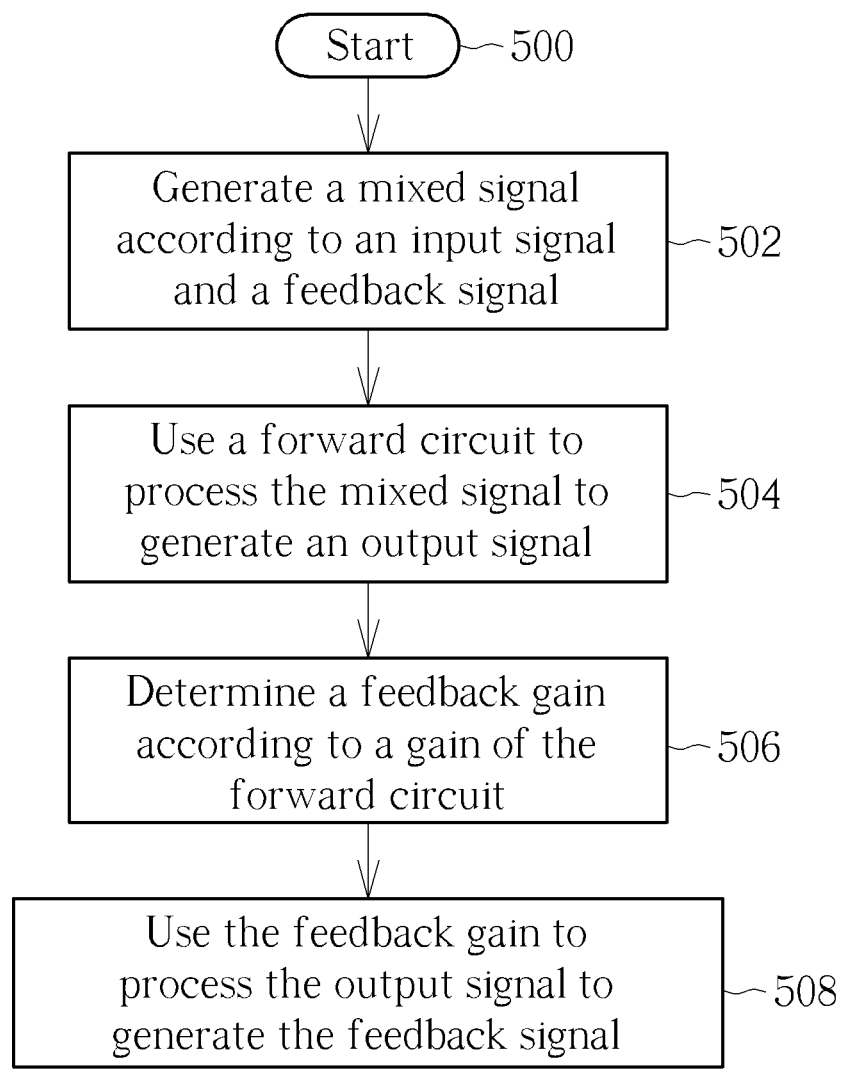
FIG. 5 is a flowchart of a signal processing method according to one embodiment of the present invention.

FIG. 5 is a flowchart of a signal processing method according to one embodiment of the present invention. Referring to the above embodiment, the flow is described as follows.

Step 500: the flow starts.

Step 502: generate a mixed signal according to an input signal and a feedback signal.

Step 504: use a forward circuit to process the mixed signal to generate an output signal.

Step 506: determine a feedback gain according to a gain of the forward circuit.

Step 508: use the feedback gain to process the output signal to generate the feedback signal.

Briefly summarized, in the feedback system of the present invention, the feedback gain of the feedback gain circuit is determined by the gain of the forward circuit, especially when the gain of the forward circuit is increased, the feedback gain is reduced, or increasing the feedback gain of the feedback gain circuit when the gain of the forward circuit decreases. By using the above mechanism, the feedback system will have a fixed/stable settling time to avoid the unexpected stabilization time that may affect the subsequent operation of the feedback system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedback system, comprising:
   a mixing circuit, configured to generate a mixed signal according to an input signal and a feedback signal;
   a forward circuit, configured to process the mixed signal to generate an output signal;

a feedback circuit and a feedback gain circuit, configured to generate the feedback signal according to the output signal; and a control circuit, coupled to the feedback gain circuit, configured to determine a feedback gain of the feedback gain circuit according to a gain of the forward circuit;

wherein when the forward circuit has a first gain, the control circuit controls the feedback gain circuit to have a first feedback gain; and when the forward circuit has a second gain different from the first gain, the control circuit controls the feedback gain circuit to have a second feedback gain different from the first feedback gain; wherein if the first gain is greater than the second gain, the first feedback gain is less than the second feedback gain;

and if the first gain is less than the second gain, the first feedback gain is greater than the second feedback gain.

2. The feedback system of claim 1, wherein the control circuit controls the feedback gain circuit so that when the forward circuit has the first gain and the second gain, the feedback system has substantially the same settling time.

3. The feedback system of claim 1, wherein when the gain of the forward circuit increases, the control circuit lowers the feedback gain of the feedback gain circuit; or when the gain of the forward circuit decreases, the control circuit increases the feedback gain of the feedback gain circuit.

4. The feedback system of claim 1, wherein the feedback gain circuit receives the output signal to generate an adjusted output signal, and the feedback circuit receives the adjusted output signal to generate the feedback signal.

5. The feedback system of claim 1, wherein the feedback circuit receives the output signal to generate an adjusted output signal, and the feedback gain circuit receives the adjusted output signal to generate the feedback signal.

6. The feedback system of claim 1, wherein the feedback system is an audio processing circuit, the forward circuit is an amplifier, the feedback circuit is a calibration circuit, and the mixing circuit uses the feedback signal to eliminate a DC offset of the output signal to generate the mixed signal.

7. A feedback system, comprising:
a mixing circuit, configured to generate a mixed signal according to an input signal and a feedback signal;
a forward circuit, configured to process the mixed signal to generate an output signal;
a feedback circuit and a feedback gain circuit, configured to generate the feedback signal according to the output signal; and
a control circuit, coupled to the feedback gain circuit, configured to determine a feedback gain of the feedback gain circuit according to a gain of the forward circuit;
wherein when the feedback system is enabled to start to receive the input signal, the control circuit obtains the gain of the forward circuit, and refers to the gain of the forward circuit to determine the feedback gain of the feedback gain circuit, to initialize the feedback system.

8. A signal processing method, comprising:
generating a mixed signal according to an input signal and a feedback signal;
using a forward circuit to process the mixed signal to generate an output signal;
determining a feedback gain according to a gain of the forward circuit; and
using the feedback gain to process the output signal to generate the feedback signal;
wherein the signal processing method is executed by an audio processing circuit, the forward circuit is an amplifier, and the step of generating the mixed signal according to the input signal and the feedback signal comprises:
using the feedback signal to eliminate a DC offset of the output signal to generate the mixed signal.

9. The signal processing method of claim 8, wherein the step of determining the feedback gain according to the gain of the forward circuit comprises:
when the forward circuit has a first gain, determining a first feedback gain; and
when the forward circuit has a second gain different from the first gain, determining a second feedback gain different from the first feedback gain;
wherein if the first gain is greater than the second gain, the first feedback gain is less than the second feedback gain; and if the first gain is less than the second gain, the first feedback gain is greater than the second feedback gain.

10. The signal processing method of claim 9, wherein the signal processing method if executed by a feedback system, and the step of determining the feedback gain according to the gain of the forward circuit comprises:
determining the feedback gain according to the gain of the forward circuit so that when the forward circuit has the first gain and the second gain, the feedback system has substantially the same settling time.

11. The signal processing method of claim 9, wherein the step of determining the feedback gain according to the gain of the forward circuit comprises:
when the gain of the forward circuit increases, lowering the feedback gain of the feedback gain circuit; or
when the gain of the forward circuit decreases, increasing the feedback gain of the feedback gain circuit.

12. The signal processing method of claim 8, wherein the step of using the feedback gain to process the output signal to generate the feedback signal comprises:
using the feedback gain to process the output signal to generate an adjusted output signal; and
using a feedback circuit to receive the adjusted output signal to generate the feedback signal.

13. The signal processing method of claim 8, wherein the step of using the feedback gain to process the output signal to generate the feedback signal comprises:
using a feedback circuit to receive the output signal to generate an adjusted output signal; and
using the feedback gain to process the adjusted output signal to generate the feedback signal.

* * * * *

UNITED STATES PATENT AND TRADEMARK OFFICE
CERTIFICATE OF CORRECTION

PATENT NO. : 11,463,058 B2
APPLICATION NO. : 17/068782
DATED : October 4, 2022
INVENTOR(S) : Shih-Hsin Lin et al.

It is certified that error appears in the above-identified patent and that said Letters Patent is hereby corrected as shown below:

On the Title Page

Item (30), delete "10813702.4" and insert --108137024--.

Signed and Sealed this
Twenty-ninth Day of November, 2022

Katherine Kelly Vidal
*Director of the United States Patent and Trademark Office*